(12) United States Patent
Kaplish

(10) Patent No.: US 7,679,349 B2
(45) Date of Patent: Mar. 16, 2010

(54) SWITCHING SYSTEMS AND METHODS WITH CURRENT SENSING

(75) Inventor: Anurag Kaplish, Sunnyvale, CA (US)

(73) Assignee: Summit Microelectronics, Inc., Sunnyvale, CA (US)

( * ) Notice: Subject to any disclaimer, the term of this patent is extended or adjusted under 35 U.S.C. 154(b) by 199 days.

(21) Appl. No.: 12/041,545

(22) Filed: Mar. 3, 2008

(65) Prior Publication Data
US 2009/0218996 A1 Sep. 3, 2009

(51) Int. Cl.
G05F 1/40 (2006.01)
G05F 1/56 (2006.01)

(52) U.S. Cl. .................................. 323/282; 323/271

(58) Field of Classification Search ......... 323/223–225, 323/268, 271, 282, 285, 349–351
See application file for complete search history.

(56) References Cited

U.S. PATENT DOCUMENTS 4,827,207 A * 5/1989 Chieli ...................... 323/316
7,432,694 B2 * 10/2008 Brenden et al. ............ 323/283
7,538,526 B2 * 5/2009 Kojima et al. ............. 323/225
2008/0203990 A1 * 8/2008 Nishida .................... 323/284

\* cited by examiner

*Primary Examiner*—Matthew V Nguyen
(74) *Attorney, Agent, or Firm*—Chad R. Walsh; Fountainhead Law Group PC

(57) ABSTRACT

Embodiments of the present invention include an electronic circuit for performing current sensing. In one embodiment, the present invention includes a first switching transistor and a second switching transistor both coupled to receive a first switching current and a switching signal, and one or more transistors coupled in a first series. A first terminal of an initial transistor in the first series is coupled to a second terminal of the second switching transistor. A second terminal of a last transistor in the first series is coupled to a reference voltage. The first switching current is coupled to a second node between the second terminal of the second switching transistor and the first terminal of the initial transistor in the first series. In this manner, the circuit produces a switching voltage corresponding to said first switching current.

20 Claims, 2 Drawing Sheets

SWITCHING SYSTEMS AND METHODS WITH CURRENT SENSING

CROSS REFERENCE TO RELATED APPLICATIONS

Not Applicable

BACKGROUND

The present invention relates to current sensing, and in particular, to switching systems and methods with current sensing. Some switching regulator systems utilize a voltage control loop and a current control loop to provide a stable output voltage source. The voltage loop provides a regulated voltage value and responds to changes in output voltage. The current loop may respond to changes in peak current. This type of current loop may react quickly to changes in the peak current and thereby allow the switching regulator system to provide better regulation under transient load conditions such as a step response on the output of the switching regulator system, for example. A current mode loop may allow for a feed-forward effect in which the current change is sensed and the peak current mode loop responds prior to the voltage significantly diverting from the regulated voltage value. A current mode control loop may help simplify the required compensation for the switching regulator system.

Current mode control requires current sensing. Directly sensing the peak currents has historically been problematic since the switching voltages associated with the load inductor in switching regulator systems may contain transient voltages well above the safe operating range of the sense electronics required to sense the peak current. This presents a reliability problem for the regulator system. Indirectly sensing the peak current by using a filter circuit or scaling circuit to provide a corresponding current or voltage is problematic due to the inaccuracies the circuits introduce. These inaccuracies make performance less predictable over manufacturing tolerances.

Thus, there is a need for improved current sensing. The present invention solves these and other problems by providing switching systems and methods with current sensing.

SUMMARY

Embodiments of the present invention relates to current sensing, and in particular, to switching systems and methods with current sensing. In one embodiment, the present invention includes an electronic circuit for current sensing. The electronic circuit comprises a first switching transistor, a second switching transistor, and one or more transistors coupled in a first series. The first switching transistor has a first terminal, a second terminal, a control terminal, and a first resistance between the first terminal and the second terminal when the control terminal is in an on state. The first terminal is coupled to a first node receiving a first switching current. The second terminal is coupled to a reference voltage. The control terminal is coupled to receive a switching signal. The second switching transistor has a first terminal coupled to the first terminal of the first switching transistor, a second terminal, a control terminal coupled to the control terminal of the first switching transistor, and a second resistance between the first terminal and the second terminal when the control terminal is in the on state. Each transistor of the one or more transistors coupled in the first series has a first terminal, a second terminal, a control terminal coupled to a bias voltage. Also each transistor has a third resistance between the first terminal and the second terminal. A first terminal of an initial transistor in the first series is coupled to the second terminal of the second switching transistor. A second terminal of a last transistor in the first series is coupled to the reference voltage. A sense current corresponding to the first switching current is coupled to a second node between the second terminal of the second switching transistor and the first terminal of the initial transistor in the first series. And in accordance therewith, produces a switching voltage corresponding to said first switching current.

In one embodiment, the reference voltage is ground.

In one embodiment, the first switching transistor, the second switching transistor, and the one or more transistors coupled in a first series are NMOS transistors.

In one embodiment, the first switching transistor comprises a plurality of transistors in parallel, wherein each transistor of said plurality of transistors in parallel includes a parallel resistance having a first value, and wherein the second resistance and the third resistance have said first value.

In one embodiment, the electronic circuit further comprises one or more transistors coupled in a second series. Each transistor of the one or more transistors coupled in a second series has a first terminal, a second terminal, and a control terminal. The control terminal is coupled to the bias voltage. Each transistor of the one or more transistors coupled in a second series also has a fourth resistance between the first terminal and the second terminal. A first terminal of an initial transistor in the second series is coupled to the second terminal of the second switching transistor. A second terminal of a last transistor in the second series is coupled to the first terminal of the initial transistor in the first series.

In one embodiment, the electronic circuit further comprises a first amplifier and one or more transistors coupled in a third series. The first amplifier has a first terminal coupled to the second node, an output terminal, and a second terminal. Each transistor of the one or more transistors coupled in the third series has a first terminal, a second terminal, a control terminal coupled to the bias voltage, and a fourth resistance between the first terminal and the second terminal. A first terminal of an initial transistor in the third series is coupled to the second terminal of the first amplifier. A second terminal of a last transistor in the third series is coupled to the reference voltage.

In one embodiment, the electronic circuit further comprises a drive transistor. The drive transistor has a first terminal, a second terminal coupled to the second terminal of the first amplifier, and a control terminal coupled to the output terminal of the first amplifier. The first terminal of the drive transistor provides a second switching current corresponding to the first switching current. The second switching current is less than the first switching current.

In one embodiment, the present invention includes an electronic circuit. The electronic circuit comprises a switching regulator configured in a current mode control loop. The switching regulator comprises a first switching transistor, a second switching transistor, and one or more transistors coupled in a first series. The first switching transistor has a first terminal, a second terminal, a control terminal, and a first resistance. The first resistance is between the first terminal and the second terminal when the control terminal is in an on state. The first terminal is coupled to a first node receiving a first switching current. The second terminal coupled to a reference voltage. The control terminal is coupled to receive a switching signal. The second switching transistor has a first terminal coupled to the first terminal of the first switching transistor, a second terminal, a control terminal coupled to the control terminal of the first switching transistor, and a second resistance. The second resistance is between the first terminal and the second terminal when the control terminal is in the on state. Each transistor of the one or more transistors coupled in the first series has a first terminal, a second terminal, a control terminal coupled to a bias voltage, and a third resistance between the first terminal and the second terminal. A first terminal of an initial transistor in the first series is coupled to the second terminal of the second switching transistor. A second terminal of a last transistor in the first series is coupled to the reference voltage. The first switching current is coupled to a second node between the second terminal of the second switching transistor and the first terminal of the initial transistor in the first series, and in accordance therewith, produces a switching voltage corresponding to said first switching current.

In one embodiment, the present invention includes a method. The method comprises the steps of receiving a first switching current, receiving a switching control signal, and coupling a sense current. The first switching current is to be sensed in a first terminal of a first transistor and a first terminal of a second transistor. The first and second transistors each comprise second terminals coupled to a reference voltage. The switching control signal is received in a control terminal of the first transistor and a control terminal of the second transistor. And in accordance therewith, a sense current is generated in the second transistor that is a fraction of the first switching current. The step of coupling includes coupling the sense current through a first plurality of series transistors. Each transistor in the first plurality of series transistors has a control terminal coupled to a bias voltage. In accordance therewith, a switching voltage is generated corresponding to the first switching current.

In one embodiment, the method further comprises coupling the sense current through a second plurality of series transistors. Each transistor in the second plurality of series transistors has a control terminal coupled to the bias voltage. The switching voltage is generated at a node between the first series and the second series.

In one embodiment, the method further comprises coupling the switching voltage to an input of a third plurality of series transistors, and in accordance therewith, generating a second switching current corresponding to the first switching current.

In one embodiment, the method further comprises amplifying, driving, and coupling. The amplifying includes amplifying a difference between the switching voltage and a negative feedback voltage resulting in a control voltage. The driving includes driving a current source with the control voltage resulting in the second switching current. The coupling includes coupling the second switching current into the third plurality of transistors. This creates the feedback voltage. The amplifying has a bandwidth and gain such that the negative feedback voltage matches the switching voltage. The third plurality of transistors and the negative feedback voltage determine the second switching current.

In one embodiment, the method further comprises combining, comparing, and modifying. The combining includes combining the second switching current with a current ramp signal resulting in a composite ramp signal. The comparing includes comparing the composite ramp signal to a first reference signal. The modifying includes modifying the switching control signal in response to the comparing. The switching control signal increases a time in which the first transistor and the second transistor are on in response to the first switching current falling below a first peak level. The switching control signal decreases the time in which the first transistor and the second transistor are on in response to the first switching current rising above the first peak level.

In one embodiment, the method further comprises rectifying, converting, scaling, and amplifying. The rectifying includes rectifying the switching current resulting in a third switching current. The converting includes converting the third switching current into an output voltage. The scaling includes scaling the output voltage resulting in a feedback voltage. The amplifying includes amplifying a difference between the feedback voltage and a reference voltage resulting in a first reference signal. The first reference signal adjusts such that the feedback voltage matches the reference voltage.

Additional embodiments will be evident from the following detailed description and accompanying drawings, which provide a better understanding of the nature and advantages of the present invention.

DETAILED DESCRIPTION

Described herein are techniques for performing current sensing. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1A:
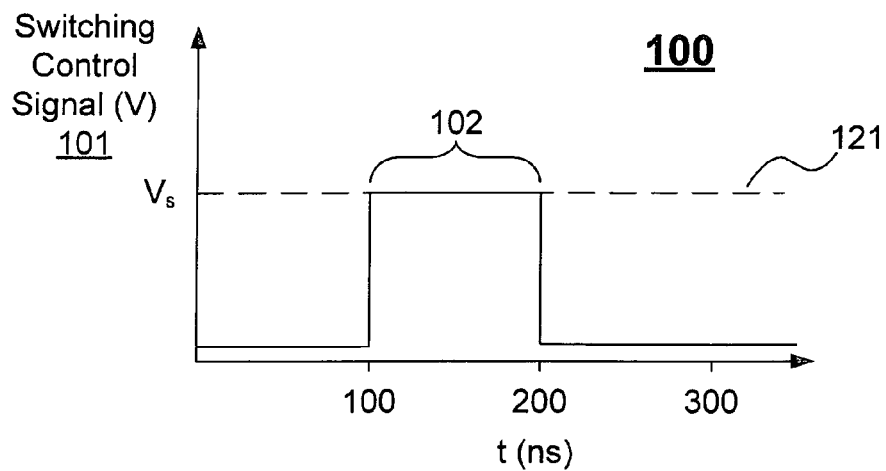
FIGS. 1A and 1B illustrate a graph and an electronic circuit for performing current sensing according to one embodiment of the present invention.
Figure 1B:
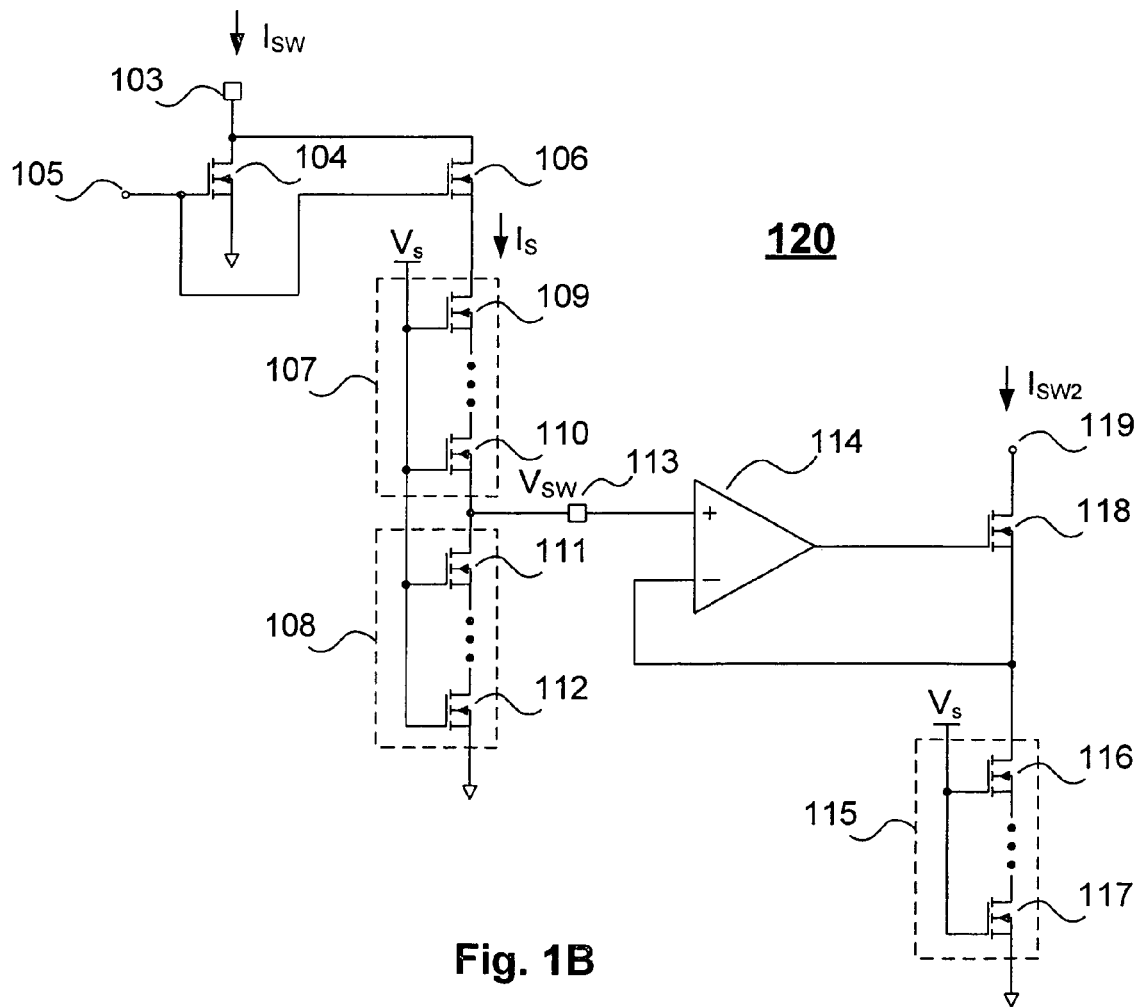

FIGS. 1A and 1B illustrate an electronic circuit for performing current sensing according to one embodiment of the present invention. FIG. 1A includes a graph 100 of a switching control signal 101 having a pulse 102 with a nominal voltage $V_S$ 121. FIG. 1B includes an electronic circuit 120. The electronic circuit 120 includes a switching transistor 104, a switching transistor 106, one or more load transistors coupled in a series 107, and one or more load transistors coupled in a series 108. This example further includes an amplifier 114, one or more load transistors coupled in a series 115, and a drive transistor 118. The switching transistor 104 has a control terminal 105 coupled to receive the switching control signal 101 depicted in graph 100. Graph 100 shows a cycle of a repetitive waveform which substantially turns on the switching transistor 104 during time period 102, referred to herein as the "on state". The switching transistor 104 has a resistance between a first terminal 103 and the second terminal (ground) when the control terminal 105 is in the on state. In some embodiments, the switching transistor 104 may comprise a plurality of transistors arranged in parallel. Each of the parallel transistors may include a parallel resistance each having a value in the on state. The first terminal 103 of transistor 104 is coupled to receive a switching current. The first terminal 103 may be coupled to a switching output node of a switching regulator, for example. The switching transistor 106 has a first terminal coupled to the first terminal 103 of the switching transistor 104, a control terminal coupled to the control terminal 105 of the switching transistor 104, and a second terminal. Transistor 106 includes a resistance between the first terminal and the second terminal when the control terminal is in the on state.

Each load transistor in the series 107 includes a first terminal, a second terminal, and a control terminal. The control terminal of each transistor in the series 107 is coupled to a bias voltage ($V_S$) which biases each transistor in an on state such that each transistor in the series 107 has a resistance between the first terminal and the second terminal. A first terminal of an initial load transistor 109 in the series 107 is coupled to the second terminal of the switching transistor 106, and a second terminal of a last load transistor 110 in the series 107 is coupled to a node 113. Each load transistor in the series 108, has a first terminal, a second terminal, and a control terminal coupled to the bias voltage ($V_S$) which biases each transistor in an on state such that each transistor in the series 108 has a resistance between the first terminal and the second terminal. A first terminal of an initial load transistor 111 in the series 108 is coupled to the node 113 and a second terminal of a last load transistor 112 in the series 108 is coupled to a reference voltage. In this example, the reference voltage is ground.

A sense current $I_S$ corresponding to the switching current $I_{SW}$ is generated through series 107 and series 108. The sense current $I_S$ is a switching current which is a fraction of the switching current $I_{SW}$. In this embodiment, the switching transistor 104 is comprised of a plurality of transistors arranged in parallel. Each transistor has a resistance between a first terminal and a second terminal in the on state, and this resistance has a value $R_V$. Furthermore, in this embodiment, the resistance of switching transistor 106, the resistance of each transistor in series 107, and the resistance of each transistor in series 108 all have the first value $R_V$. The resistances form a current divider with a predetermined value based on the number of transistors comprising the switching transistor 104, switching transistor 106, the series 107, and the series 108.

$$R_A = \frac{Rparallel}{N} = \frac{R_V}{N}$$

$$R_B = R_{transistor106} + R_{series107} = R_V + S(R_V)$$

$$R_C = R_{series108} = Q(R_V)$$

$$I_S = I_{SW} \cdot \frac{R_A}{R_A + R_B + R_C} = I_{SW} \cdot \frac{1}{1 + N(1+S) + NQ}$$

N transistors comprise the switching transistor 104. S is the number of transistors comprising the series 107. Q is the number of transistors comprising the series 108. Since S, N, and P are all integers, the sense current $I_S$ is a predetermined fraction of the switching current $I_{SW}$, and not dependent on the value of $R_V$.

The amplifier 114 has a first terminal coupled to a node 113, an output terminal coupled to a control terminal of the drive transistor 118, and an inverting terminal. Each load transistor in the series 115 has a first terminal, a second terminal, and a control terminal coupled to the bias voltage ($V_S$), which biases each transistor in the on state such that each transistor in the series 115 has a resistance between a first terminal and a second terminal. While the transistor "ON" resistances are described above in the context of the resistances associated with switching transistor 104, switching transistor 106, the transistors of series 107, and the transistors of series 108, it is to be understood that these terms are used to refer resistances of different transistors, rather than to distinguish resistance values. The resistances may have the same resistance values or different resistance values. A first terminal of an initial load transistor 116 in the series 115 is coupled to the inverting terminal of the first amplifier 114, and a second terminal of a last load transistor 117 in the series 115 is coupled to the reference voltage. The drive transistor 118 has a first terminal, a second terminal coupled to the inverting terminal of the first amplifier 114, and a control terminal coupled to the output terminal of the first amplifier 114.

Terminal 119 provides a switching current $I_{SW2}$ corresponding to the switching current $I_{SW}$. The amplifier 114 converts the switching voltage $V_{SW}$ to a switching current $I_{SW2}$. Amplifier 114 drives the control input of the drive transistor 118 such that current $I_{SW2}$ generates a voltage at the inverting terminal of the first amplifier that matches the switching voltage $V_{SW}$ at the non-inverting terminal of the first amplifier 114. In this embodiment, the series 115 of transistors are biased in the on state, and the resistances associated with switching transistor 104, switching transistor 106, the transistors of series 107, the transistors of series 108, and the transistors of series 115 all have the value $R_V$. Amplifier 114, the drive transistor 118, and the series 115 form a current scalar with a predetermined value based on the number of transistors comprising the switching transistor 104, switching transistor 106, the series 107, the series 108, and the series 109.

$$R_A = \frac{Rparallel}{N} = \frac{R_V}{N}$$

$$R_B = R_{transistor106} + R_{series107} = R_V + S(R_V)$$

$$R_C = R_{series108} = Q(R_V)$$

$$I_S = I_{SW} \cdot \frac{R_A}{R_A + R_B + R_C} = I_{SW} \cdot \frac{1}{1 + N(1+S) + NQ}$$

$$V_{SW} = I_{SW} \cdot \frac{R_A \cdot R_C}{R_A + R_B + R_C} = I_{SW} \cdot \frac{Q(R_V)}{1 + N(1+S) + NQ}$$

$$R_D = R_{series115} = M(R_V)$$

$$I_{SW2} = \frac{V_{SW}}{R_4} = I_{SW} \cdot \frac{R_A \cdot R_C}{R_D(R_A + R_B + R_C)} = I_{SW} \cdot \frac{Q}{M(1 + N(1+S) + NQ)}$$

N transistors comprise the switching transistor 104. S is the number of transistors comprising the series 107. Q is the number of transistors comprising the series 108. M is the number of transistors comprising series 115. Since S, N, P, and M are all integers, the switching current $I_{SW2}$ is a predetermined fraction of the switching current $I_{SW}$, and not dependent on the value $R_V$. The selection of N may be selected based on the current requirements of the switching current for a given application. The selection of S, P, and M may be selected based on the sense current requirements. For example, a sense current may be chosen small enough so that power is conserved, but large enough to produce a stable result given the range of switching current used in a given application. Also, S and P may be chosen so that the switching voltage $V_{SW}$ is within the range of the supply voltage rails of the internal circuitry of the switching regulator.

Electronic circuit 120 senses the peak current passing through the first terminal 103. Both the switching transistor 104 and the switching transistor 106 have control terminals which are provided with switching control signal 101 including a voltage level 121 ($V_S$). Graph 100 shows a segment of the switching control signal 101 which may be comprised of a pulse train having a duty cycle corresponding to an output voltage of a switching regulator, for example. Due to the similarity of the transistors and the same switching control signal 101, the switching transistor 106 may be switching a sense current proportional to the current the first transistor 104 is switching. For example, this relationship may be a ratio due to the proportional sizing of the transistors. For example, the switching transistor 104 may be comprised of many transistors coupled in parallel and each transistor having matching geometries to each other and to the switching transistor 106, and in this way the switching current may be divided proportionally between the switching transistor 104 and the switching transistor 106. The series 108 or the series 107 or both may be comprised of transistors which may be similar to the switching transistor 106. The biasing of the control terminal of the transistors in the series 108 and the series 107 substantially matches the voltage 121 presented to the switching transistors (104 & 106) during the on state. In this way, the division of the switching current may remain proportional between the current flowing through the switching transistor 104 and the sensing path which includes the switching transistor 106, the series 107, and the series 108. The actual number of transistors comprising the series 108 and the series 107 depends on the resistance between the first terminal and the second terminal of each transistor when biased in the on state. This value and the number of transistors in the series and the series would be factors in determining how much current would flow through the sensing path and also determine the voltage range of the switching voltage generated at the node 113. This switching voltage would correspond to the switching current flowing through terminal 103. The first amplifier 114 drives transistor 118 to provide a voltage at the inverting terminal of the first amplifier 114 which substantially matches the switching voltage at the node 113. The series 115 may be comprised of transistors which may be similar to the transistors comprising the series 107. The switching voltage $V_{SW}$ is transformed to a switching current $I_{SW2}$ corresponding to the switching current $I_{SW}$. This switching current is driven by drive transistor 118 through terminal 119. The transistors depicted in this embodiment are NMOS transistors, but many other MOS transistors may be used in an equivalent circuit including PMOS and DMOS. The amplifier 114 may be comprised of MOS transistors as well, but may also be comprised of bipolar transistors or a combination of both MOS and bipolar transistors.

Figure 2:
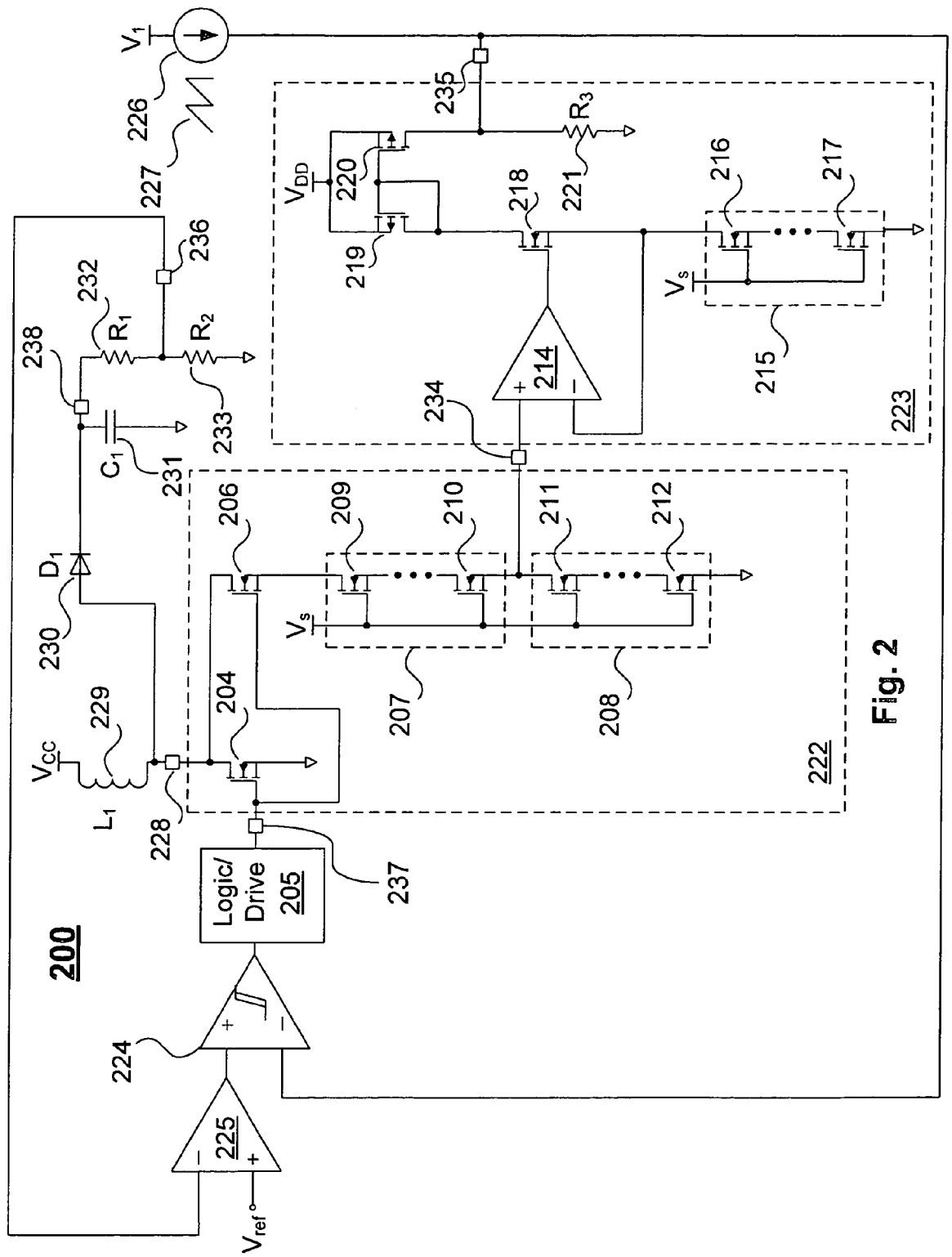
FIG. 2 illustrates a switching regulator system with current sensing according to another embodiment of the present invention.

FIG. 2 illustrates a switching regulator system with current sensing according to another embodiment of the present invention. FIG. 2 includes a switching regulator system 200. The switching regulator system 200 includes a current sensing circuit 222, a summation circuit 223, a current ramp generator 226, a comparator 224, a logic drive circuit 205, an error amplifier 225, a inductor 229, a diode 230, a capacitor 231, a resistor 232, and a resistor 233. A peak current mode control loop includes the inductor 229, the current sensing circuit 222, the summation circuit 223, the current ramp generator 226, the comparator 224, the logic drive circuit 205. A voltage source ($V_{cc}$) is coupled to one terminal of the inductor 229. The other terminal of the inductor 229 is coupled through a switching node 228 of the current sensing circuit 222. The current sensing circuit 222 has a control terminal 237 coupled to receive a switching control signal from the logic drive circuit 205. The summation circuit 223 is coupled to receive a switching voltage through a node 234 of the current sensing circuit 222. The summation circuit 223 converts the switching voltage to a switching current corresponding to the switching current, combines a current ramp signal 227 from the current ramp generator 226, and converts the combined signal to a voltage at a summation terminal 235 of the summation circuit 223. This summation terminal 235 is coupled to the inverting terminal of the comparator 224. An output terminal of the comparator 224 is coupled the input of logic/drive circuit 205. The current sensing and feedback to comparator 224 provides current control for the regulator system.

The current sensing circuit 222 includes a switching transistor 204, a switching transistor 206, one or more load transistors coupled in a series 207, and one or more load transistors coupled in a series 208. Current sensing circuit 222 functions in a similar manner as corresponding components 104, 106, 107, and 108 function in circuit 100 described above.

The summation circuit 223 includes a amplifier 214, a drive transistor 218, one or more load transistors coupled in a series 215, and current mirror comprising transistor 219 and 220, and a resistor 221. The amplifier 214, the drive transistor 218, and series 215 functions in a similar manner as corresponding components 114, 118, and 115 function in circuit 100 described above.

The first terminal of the drive transistor 218 is coupled to a first terminal and a control terminal of transistor 219. The second terminal of transistor 219 is coupled to a voltage supply ($V_{DD}$). Transistor 220 has a control terminal coupled to the control terminal of transistor 219, a first terminal coupled to the summation terminal 235, and a second terminal coupled to the voltage supply ($V_{DD}$). Transistors 219 and 220 form the current mirror. Resistor 221 is also coupled to the summation node 235. The current mirror redirects the switching current so that the resistor 221 may combine the switching current and the current ramp signal 226. The resistor 221 also converts the combined signal into a voltage suitable for the comparator 224. The comparator 224 has an output terminal coupled to the input terminal of the logic/drive circuit 205, and the logic/drive circuit 205 has an output terminal coupled to drive the switching transistor 204 and the switching transistor 206. The current sensing and feedback to comparator 224 provides current control for the regulator system 200.

The switching regulator system 200 further includes a voltage control loop comprising the inductor 229, the switching transistor 204, the diode 230, the capacitor 231, the resistor 232, the resistor 233, the error amplifier 225, the comparator 224, and the logic drive circuit 205. The second terminal of the inductor 229 is coupled to the first terminal of the diode 230. The second terminal of the diode 230 is coupled to the first terminal of the capacitor 231 and to the first terminal of the resister 232. The second terminal of the capacitor 231 is coupled to ground. The second terminal of the resistor 232 is coupled to a voltage feedback node 236. A first terminal of the resistor 233 is coupled to the voltage feedback node 236. A second terminal of the resistor 233 is coupled to ground. The voltage feedback node 236 is coupled to the inverting terminal of error amplifier 225. The non-inverting terminal of error amplifier 225 is coupled to a voltage reference ($V_{ref}$). The output terminal of the error amplifier 225 is coupled to the non-inverting terminal of the comparator 224. The comparator 224, the logic/drive circuit 205, and the switching transistor 204 are coupled as previously described and are included in both the voltage control loop and the current control loop in this embodiment.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, switching systems and methods with current sensing according to the present invention may include some or all of the innovative features described above. Based on the above disclosure and the following claims, other arrangements, embodiments, implementations and equivalents will be evident to those skilled in the art and may be employed without departing from the spirit and scope of the invention as defined by the claims.

What is claimed is:

1. An electronic circuit comprising:
a first switching transistor having a first terminal, a second terminal, a control terminal, and a first resistance between the first terminal and the second terminal when the control terminal is in an on state, the first terminal coupled to a first node receiving a first switching current, the second terminal coupled to a reference voltage, and the control terminal coupled to receive a switching signal;
a second switching transistor having a first terminal coupled to the first terminal of the first switching transistor, a second terminal, a control terminal coupled to the control terminal of the first switching transistor, and a second resistance between the first terminal and the second terminal when the control terminal is in the on state; and
one or more transistors coupled in a first series, each transistor having a first terminal, a second terminal, a control terminal coupled to a bias voltage, and a third resistance between the first terminal and the second terminal, wherein a first terminal of an initial transistor in the first series is coupled to the second terminal of the second switching transistor, and a second terminal of a last transistor in the first series is coupled to the reference voltage,
wherein a sense current corresponding to the first switching current is coupled to a second node between the second terminal of the second switching transistor and the first terminal of the initial transistor in the first series, and in accordance therewith, produces a switching voltage corresponding to said first switching current.

2. The electronic circuit of claim 1 wherein the reference voltage is ground.

3. The electronic circuit of claim 1 wherein the first switching transistor, the second switching transistor, and the one or more transistors coupled in a first series are NMOS transistors.

4. The electronic circuit of claim 1 wherein the first switching transistor comprises a plurality of transistors in parallel, wherein each transistor of said plurality of transistors in parallel includes a parallel resistance having a first value, and wherein the second resistance and the third resistance have said first value.

5. The electronic circuit of claim 1 further comprising:
one or more transistors coupled in a second series, each transistor having a first terminal, a second terminal, a control terminal coupled to the bias voltage, and a fourth resistance between the first terminal and the second terminal, wherein a first terminal of an initial transistor in the second series is coupled to the second terminal of the second switching transistor, and a second terminal of a last transistor in the second series is coupled to the first terminal of the initial transistor in the first series.

6. The electronic circuit of claim 1 further comprising:
a first amplifier having a first terminal coupled to the second node, an output terminal, and a second terminal; and
one or more transistors coupled in a third series, each transistor having a first terminal, a second terminal, a control terminal coupled to the bias voltage, and a fourth resistance between the first terminal and the second terminal, wherein a first terminal of an initial transistor in the third series is coupled to the second terminal of the first amplifier, and a second terminal of a last transistor in the third series is coupled to the reference voltage.

7. An electronic circuit of claim 6 further comprising:
a drive transistor having a first terminal, a second terminal coupled to the second terminal of the first amplifier, and a control terminal coupled to the output terminal of the first amplifier,
wherein the first terminal of the drive transistor provides a second switching current corresponding to the first switching current, and
wherein the second switching current is less than the first switching current.

8. An electronic circuit comprising a switching regulator configured in a current mode control loop comprising
a first switching transistor having a first terminal, a second terminal, a control terminal, and a first resistance between the first terminal and the second terminal when the control terminal is in an on state, the first terminal coupled to a first node receiving a first switching current, the second terminal coupled to a reference voltage, and the control terminal coupled to receive a switching signal;
a second switching transistor having a first terminal coupled to the first terminal of the first switching transistor, a second terminal, a control terminal coupled to the control terminal of the first switching transistor, and a second resistance between the first terminal and the second terminal when the control terminal is in the on state; and
one or more transistors coupled in a first series, each transistor having a first terminal, a second terminal, a control terminal coupled to a bias voltage, and a third resistance between the first terminal and the second terminal,
wherein a first terminal of an initial transistor in the first series is coupled to the second terminal of the second switching transistor, and a second terminal of a last transistor in the first series is coupled to the reference voltage,
wherein the first switching current is coupled to a second node between the second terminal of the second switching transistor and the first terminal of the initial transistor in the first series, and in accordance therewith, produces a switching voltage corresponding to said first switching current.

9. The electronic circuit of claim 8 wherein the first switching transistor comprises a plurality of transistors in parallel, wherein each transistor of said plurality of transistors in parallel includes a parallel resistance having a first value, and wherein the second resistance and the third resistance have said first value.

10. The electronic circuit of claim 8 wherein the current mode control loop further comprises:
one or more transistors coupled in a second series, each transistor having a first terminal, a second terminal, a control terminal coupled to the bias voltage, and a fourth resistance between the first terminal and the second terminal, wherein a first terminal of an initial transistor in the second series is coupled to the second terminal of the second switching transistor, and a second terminal of a last transistor in the second series is coupled to the first terminal of the initial transistor in the first series.

11. The electronic circuit of claim 8 wherein the current mode control loop further comprises:
a first amplifier having a first terminal coupled to the second node, an output terminal coupled to provide a drive voltage, and an second terminal; and one or more transistors coupled in a third series, each transistor having a first terminal, a second terminal, a control terminal coupled to the bias voltage, and a fifth resistance between the first terminal and the second terminal, wherein a first terminal of an initial transistor in the third series is coupled to the second terminal of the first amplifier, and a second terminal of a last transistor in the second series is coupled to a reference voltage.

12. The electronic circuit of claim 11 wherein the peak current mode control loop further comprises:

a drive transistor having a first terminal, a second terminal coupled to the second terminal of the first amplifier, a control terminal coupled to the output terminal of the first amplifier, wherein the first terminal provides a second switching current corresponding to the first switching current.

13. The electronic circuit of claim 8 wherein the current mode control loop further comprises:

a first inductor having a first terminal coupled to receive a first power voltage and a second terminal coupled to the first node;

a logic drive circuit having an output terminal coupled to the control terminal of the first switching transistor and an input terminal;

a comparator having an output terminal coupled to the input terminal of the logic drive circuit, a first terminal, and an second terminal; and a summation circuit coupled to receive the switching voltage and coupled to receive a first signal, wherein the summation circuit provides a second signal corresponding to the switching voltage and the first signal, wherein the second signal is coupled to the second terminal of the comparator.

14. A method comprising:

receiving a first switching current to be sensed in a first terminal of a first transistor and a first terminal of a second transistor, wherein the first and second transistors each comprise second terminals coupled to a reference voltage;

receiving a switching control signal in a control terminal of the first transistor and a control terminal of the second transistor, and in accordance therewith, generating a sense current in the second transistor that is a fraction of the first switching current; and coupling the sense current through a first plurality of series transistors, wherein each transistor in said first plurality of series transistors has a control terminal coupled to a bias voltage, and in accordance therewith, generating a switching voltage corresponding to the first switching current.

15. The method of claim 14 wherein the first transistor comprises a first plurality of parallel transistors, the second transistor comprises a second plurality of parallel transistors, and wherein each transistor in the first plurality of parallel transistors, the second plurality of parallel transistors, and the first plurality of series transistors have a same resistance when in an on state.

16. The method of claim 14 further comprising coupling the sense current through a second plurality of series transistors, wherein each transistor in said second plurality of series transistors has a control terminal coupled to the bias voltage, and wherein said switching voltage is generated at a node between the first series and the second series.

17. The method of claim 16 further comprising coupling the switching voltage to an input of a third plurality of series transistors, and in accordance therewith, generating a second switching current corresponding to the first switching current.

18. The method of claim 17 wherein the coupling the switching voltage includes amplifying a difference between the switching voltage and a negative feedback voltage resulting in a control voltage;

driving a current source with the control voltage resulting in the second switching current; and coupling the second switching current into the third plurality of transistors, thereby creating the feedback voltage, wherein the amplifying has a bandwidth and gain such that the negative feedback voltage matches the switching voltage, wherein the third plurality of transistors and the negative feedback voltage determine the second switching current.

19. The method of claim 17 further comprising:

combining the second switching current with a current ramp signal resulting in a composite ramp signal;

comparing the composite ramp signal to a first reference signal; and modifying the switching control signal in response to the comparing, wherein the switching control signal increases a time in which the first transistor and the second transistor are on in response to the first switching current falling below a first peak level, wherein the switching control signal decreases the time in which the first transistor and the second transistor are on in response to the first switching current rising above the first peak level.

20. The method of claim 17 further comprising rectifying the switching current resulting in a third switching current;

converting the third switching current into an output voltage;

scaling the output voltage resulting in a feedback voltage; and amplifying a difference between the feedback voltage and a reference voltage resulting in a first reference signal, wherein the first reference signal adjusts such that the feedback voltage matches the reference voltage.

* * * * *